United States Patent [19]
Gardner et al.

[11] Patent Number: 6,096,591
[45] Date of Patent: *Aug. 1, 2000

[54] METHOD OF MAKING AN IGFET AND A PROTECTED RESISTOR WITH REDUCED PROCESSING STEPS

[75] Inventors: Mark I. Gardner, Cedar Creek; Daniel Kadosh; Derick J. Wristers, both of Austin, all of Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/911,746

[22] Filed: Aug. 15, 1997

Related U.S. Application Data

[63] Continuation-in-part of application No. 08/884,802, Jun. 30, 1997, abandoned.
[51] Int. Cl.[7] .............................................. H01L 21/8234
[52] U.S. Cl. ........................ 438/238; 438/586; 438/587; 438/598; 438/599; 438/549; 438/552; 438/405; 438/382; 438/383; 257/350; 257/358; 257/379
[58] Field of Search ...................... 438/238, 382, 438/383, 405, 549, 552, 586, 587, 598, 599; 257/350, 358, 379

[56] References Cited

U.S. PATENT DOCUMENTS

| | | | |
|---|---|---|---|
| 4,309,626 | 1/1982 | Kudo | 307/303 |
| 4,356,622 | 11/1982 | Widmann | 29/571 |
| 5,260,595 | 11/1993 | Hayama | 257/379 |
| 5,316,964 | 5/1994 | Gross | 437/60 |
| 5,444,024 | 8/1995 | Anjum et al. | 437/200 |
| 5,550,084 | 8/1996 | Anjum et al. | 437/200 |
| 5,589,423 | 12/1996 | White et al. | 437/228 |
| 5,773,339 | 6/1998 | Okamoto et al. | 438/210 |
| 5,838,033 | 11/1998 | Smooha | 257/213 |
| 5,883,010 | 3/1999 | Merrill et al. | 438/743 |

OTHER PUBLICATIONS

Ng, Kwok K., "Complete Guide to Semiconductor Devices", published by McGraw–Hill, Inc., New York, 1995, pp. 105–106.

Wolf, Stanley, "Silicon Processing for the VLSI Era, vol. 2:Process Integration", published by Lattice Press, Sunset Beach, CA, 1990, pp. 353–355.

Streetman, Ben G., "Solid State Electric Devices", Fourth Edition, published by Prentice Hall, Englewood Cliffs, NJ, 1995, pp. 733–736.

*Primary Examiner*—John F. Niebling
*Assistant Examiner*—Lynne A. Gurley
*Attorney, Agent, or Firm*—Skjerven, Morrill, MacPherson, Franklin, & Friel, L.L.P.

[57] ABSTRACT

A method of making an IGFET and a protected resistor includes providing a semiconductor substrate with an active region and a resistor region, forming a gate over the active region, forming a diffused resistor in the resistor region, forming an insulating layer over the gate and the diffused resistor, forming a masking layer over the insulating layer that covers the resistor region and includes an opening above the active region, applying an etch using the masking layer as an etch mask so that unetched portions of the insulating layer over the active region form spacers in close proximity to opposing sidewalls of the gate and an unetched portion of the insulating layer over the resistor region forms a resistor-protect insulator, and forming a source and a drain in the active region. In this manner, a single insulating layer provides both sidewall spacers for the gate and a resistor-protect insulator for the diffused resistor.

39 Claims, 9 Drawing Sheets

METHOD OF MAKING AN IGFET AND A PROTECTED RESISTOR WITH REDUCED PROCESSING STEPS

CROSS-REFERENCE TO RELATED APPLICATIONS

This is a continuation-in-part of U.S. application Ser. No. 08/884,802, filed Jun. 30, 1997, entitled "Method of Making an IGFET and a Protected Resistor with Reduced Processing Steps" (abandoned).

BACKGROUND OF THE INVENTION

1. Field of the Invention

The present invention relates to integrated circuit manufacturing, and more particularly to a method of making insulated-gate field-effect transistors and diffused resistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide the gate. Thereafter, the gate provides an implant mask during the implantation of source and drain regions, and the implanted dopants are driven-in and activated using a high-temperature anneal that would otherwise melt the aluminum.

As IGFET dimensions are reduced and the supply voltage remains constant (e.g., 3 V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate, and a heavy implant is self-aligned to spacers adjacent to the gate. The spacers are typically oxides or nitrides. The purpose of the lighter dose is to form a lightly doped region of the drain (or LDD) at the edge near the channel. The heavier dose forms a low resistivity heavily doped region of the drain. Since the heavily doped region is farther away from the channel than a conventional drain structure, the depth of the heavily doped region can be made somewhat greater without adversely affecting the device characteristics. A known fabrication sequence includes forming lightly doped source/drain regions, forming the spacers, and then forming heavily doped source/drain regions. Another known fabrication sequence includes forming disposable spacers, forming heavily doped source/drain regions, removing the disposable spacers, and then forming lightly doped source/drain regions (between the heavily doped source/drain regions and the gate).

Providing low resistance contacts for the gate, source and drain can be accomplished using refractory metal silicide. In one approach, a thin layer of refractory metal is deposited over the structure after the forming lightly doped source/drain regions and the spacers and the heavily doped source/drain regions, and heat is applied to form a silicide wherever the refractory metal is adjacent to silicon (including single crystal silicon and polysilicon). Thereafter, an etch is applied that removes unreacted refractory metal over the spacers to prevent bridging silicide contacts for the gate, source and drain. Various suicides, including PtSi, $MoSi_2$, $CoSi_2$ and $TiSi_2$ have been used for this purpose. For instance, the sheet resistance of titanium silicide ($TiSi_2$) is as low as 3 to 6 $\Omega$/sq, whereas heavily doped polysilicon exhibits a sheet resistance on the order of 15 to 30 $\Omega$/sq. Another advantage to this approach is that the silicide contacts for the gate, source and drain are formed simultaneously and are self-aligned by the spacers. This self-aligned silicide is sometimes referred to as "salicide."

After the silicide contacts are formed, typically an oxide layer is formed over the device, contact windows are etched in the oxide layer to expose the silicide contacts, one or more layers of metallization are deposited over the oxide layer and into the contact windows and the metallization above the oxide layer is removed to form metal plugs in the contact windows, and further metallization selectively interconnects the plugs. Eventually, a passivation layer is deposited over the substrate.

Resistors can be classified as those fabricated in integrated circuits and as discrete components. Integrated resistors can be further classified as diffused resistors, thin-film resistors, epitaxial resistors, and pinch resistors. Diffused resistors are formed by doping or counterdoping a region of the semiconductor substrate, for instance by ion implantation or solid phase diffusion. Thin-film resistors are typically polysilicon, amorphous silicon, or metal alloys such as silicides. Epitaxial resistors are a region of an epitaxial surface layer of a substrate. Pinch resistors are a by-product of bipolar technology (or JFET technology) where the base-layer is pinched by the top emitter diffusion.

Diffused resistors in npn bipolar processes are formed by using the shallow diffusion for the transistor base and emitter regions, or by using doped epitaxial regions. In NMOS and PMOS processes, diffused resistors are formed using process steps that dope the source/drain regions. In complementary metal-oxide semiconductor (CMOS) processes, the N-well and P-well masks can be configured so that diffused resistors are formed by the well implants, punchthrough implants, and threshold adjust implants. The resistance of diffused resistors depends on the length, width, depth and sheet resistance of the diffusion, which are generally known with good accuracy. Design criteria for diffused resistors also include geometric factors, such as rounding corners subject to high current density.

A resistor-protect insulator is usually formed over a diffused resistor before depositing a refractory metal over the substrate. Otherwise, the silicide would form on the entire diffused resistor and render it useless. Typically, the resistor-protect insulator is formed after forming the source and the drain by depositing an insulating layer over the substrate, forming a photoresist layer on the insulating layer, etching the insulating layer and removing the photoresist layer.

In semiconductor manufacturing, it is highly desirable to reduce the number of process steps. Accordingly, a need exists for an improved method of making an IGFET and a protected resistor with a reduced number of process steps, particularly where the method forms a lightly doped drain and silicide contacts for the gate, source and drain.

SUMMARY OF THE INVENTION

An object of the invention is to provide an improved method of making an IGFET and a protected resistor with a reduced number of processing steps. Generally speaking, this is accomplished by using a single insulating layer to form both sidewall spacers for the gate and a resistor-protect insulator for the resistor.

In accordance with one aspect of the invention, a method of making an IGFET and a protected resistor includes providing a semiconductor substrate with an active region and a resistor region, forming a gate over the active region, forming a diffused resistor in the resistor region, forming an insulating layer over the gate and the diffused resistor, forming a masking layer over the insulating layer that covers the resistor region and includes an opening above the active region, applying an etch using the masking layer as an etch mask so that unetched portions of the insulating layer over the active region form spacers in close proximity to opposing sidewalls of the gate and an unetched portion of the insulating layer over the resistor region forms a resistor-protect insulator, and forming a source and a drain in the active region.

Preferably, the method also includes implanting lightly doped source and drain regions into the active region using the gate as an implant mask for the active region, and implanting heavily doped source and drain regions into the active region using the gate and spacers as an implant mask for the active region. The diffused resistor can be formed during a well implant before implanting the lightly doped source and drain regions, or alternatively the diffused resistor can be formed as the lightly doped source and drain regions are implanted. The masking layer can provide an implant mask for the diffused resistor as the heavily doped source and drain regions are implanted, or alternatively the masking layer can be stripped and the resistor-protect insulator can provide an implant mask for the diffused resistor as the heavily doped source and drain regions are implanted.

It is also preferred that silicide contacts are formed on the gate, source and drain, and that the resistor-protect insulator prevents underlying silicide formation on the diffused resistor.

As exemplary materials, the gate is polysilicon, the resistor-protect insulator and the spacers are silicon dioxide, and the masking layer is photoresist.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

In the drawings, depicted elements are not necessarily drawn to scale and like or similar elements may be designated by the same reference numeral throughout the several views.

Figure 1A:
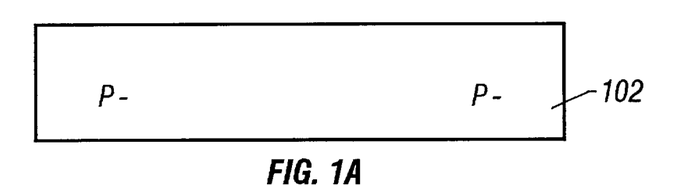
FIGS. 1A–1R show cross-sectional views of successive process steps for making an IGFET and a protected resistor in accordance with a first embodiment of the invention.
Figure 1B:
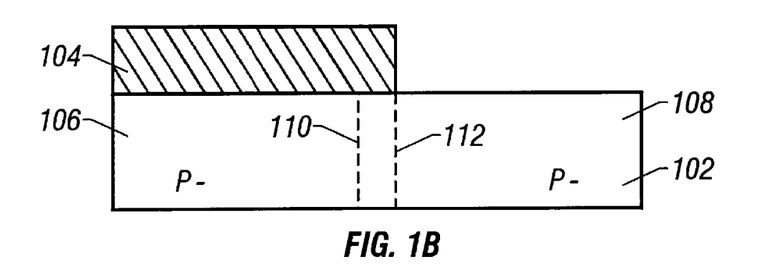
Figure 1C:
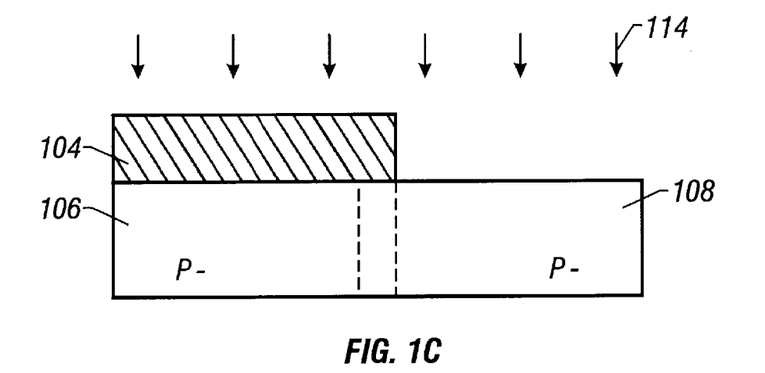
Figure 1D:
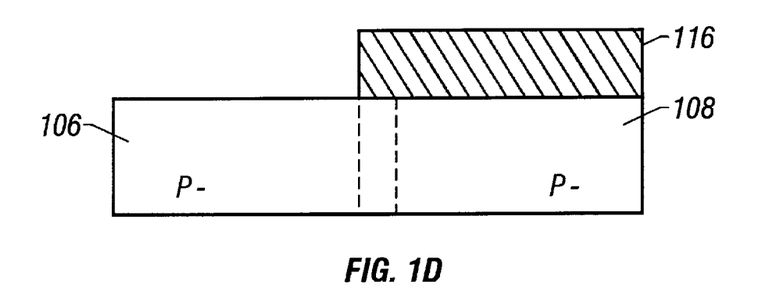
Figure 1E:
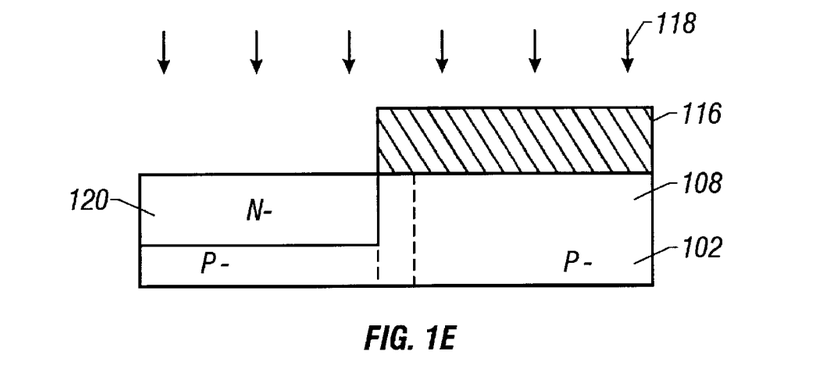
Figure 1F:
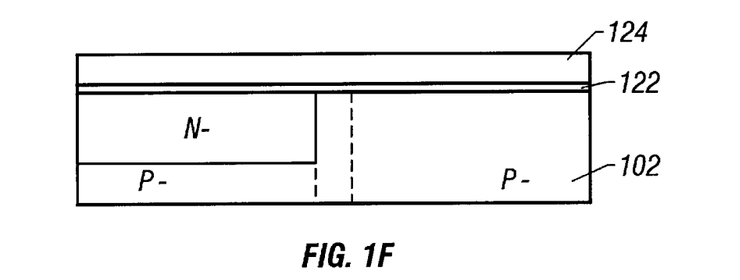
Figure 1G:
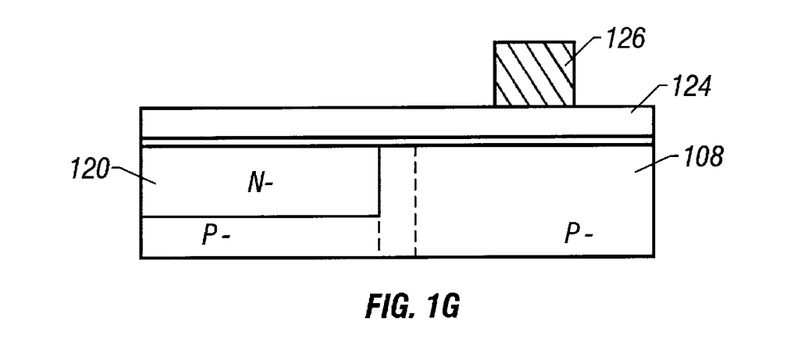
Figure 1H:
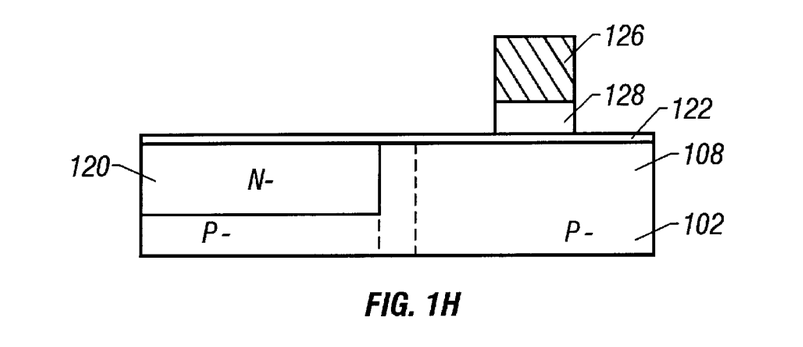
Figure 1I:
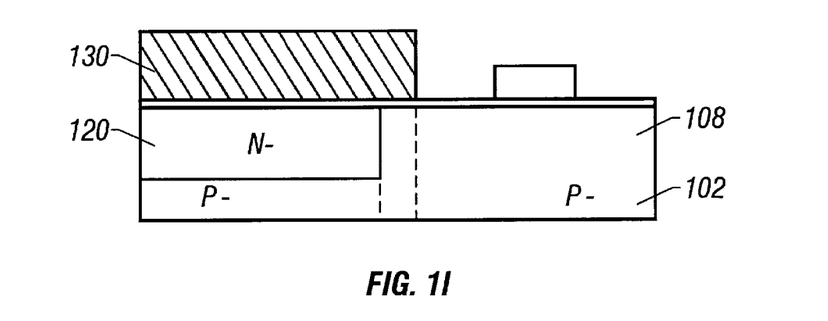
Figure 1J:
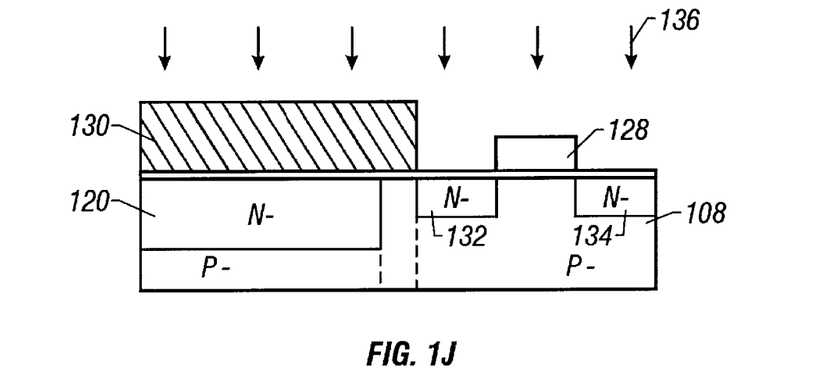
Figure 1K:
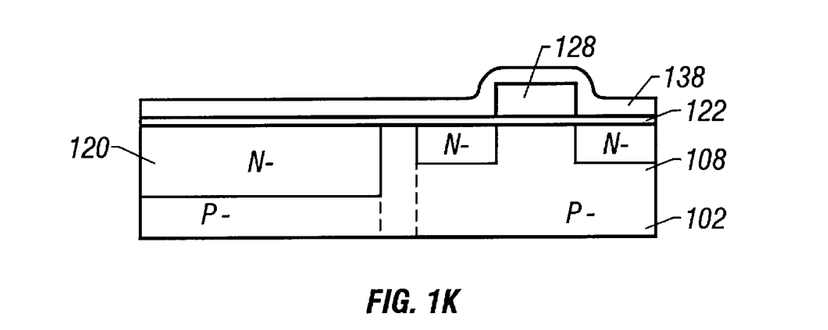
Figure 1L:
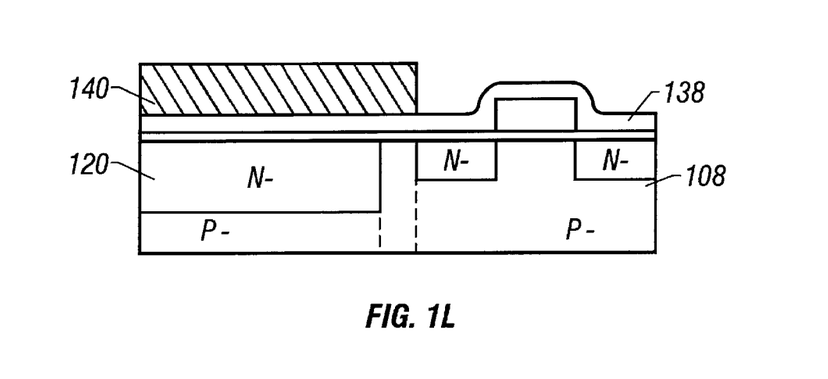
Figure 1M:
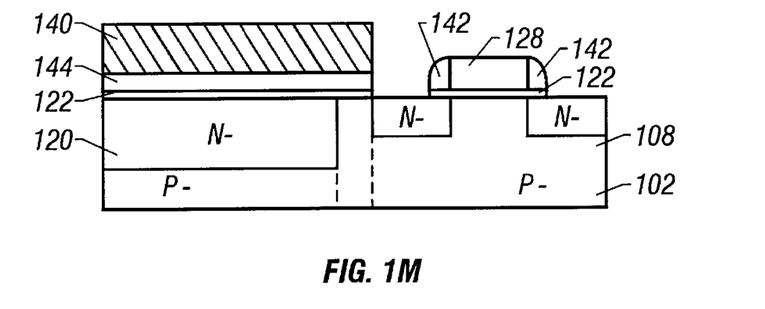
Figure 1N:
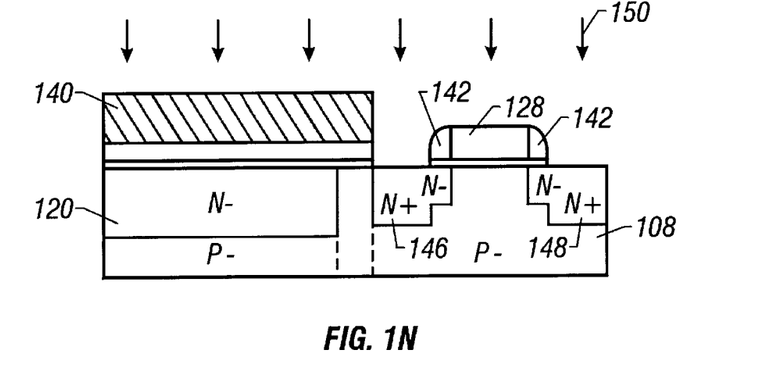
Figure 1O:
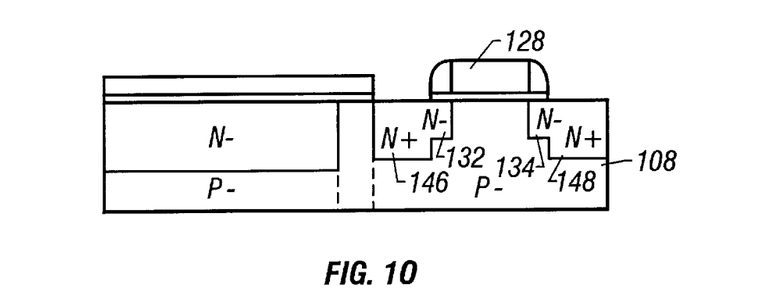
Figure 1P:
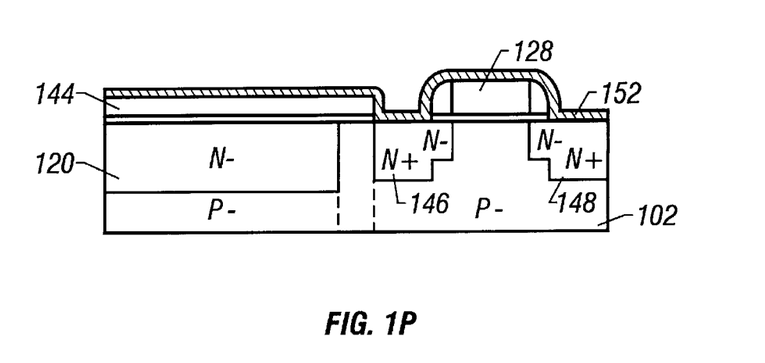
Figure 1Q:
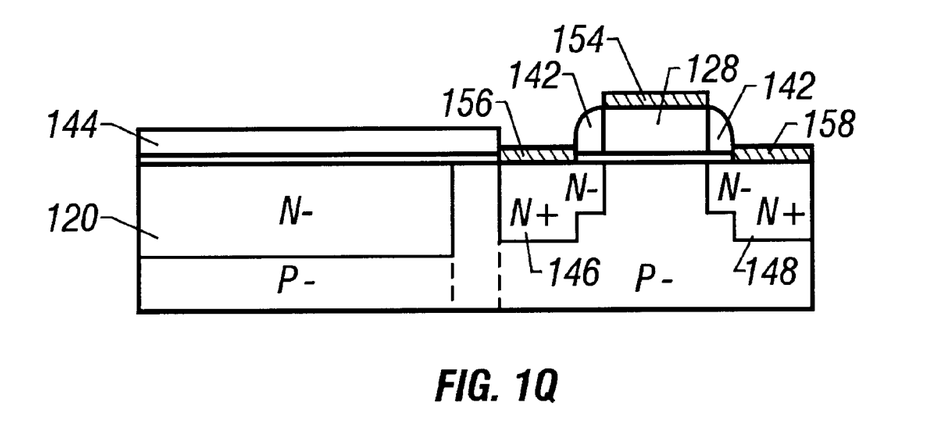
Figure 1R:
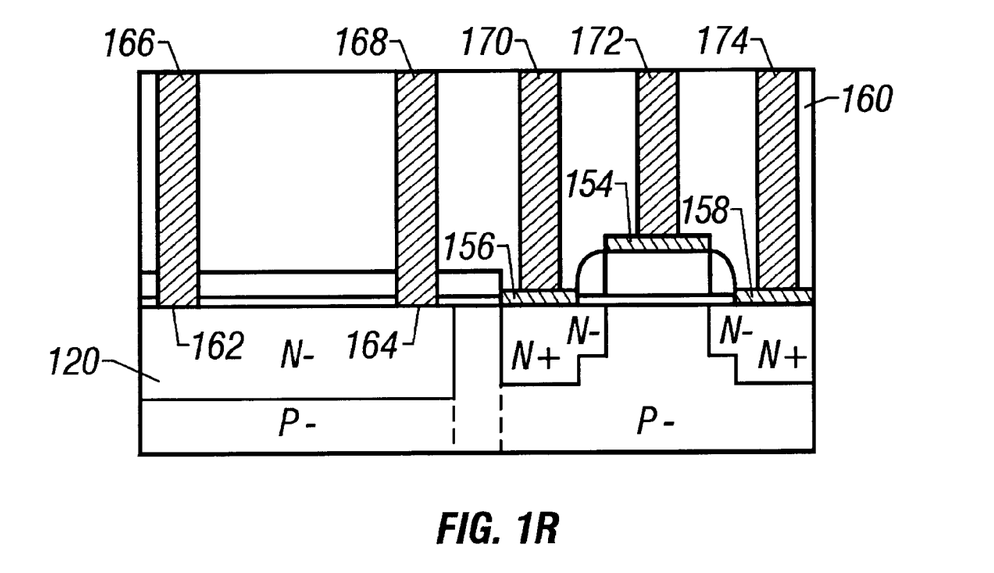

FIGS. 1A–1R show cross-sectional views of successive process steps for making an IGFET and a protected resistor in accordance with a first embodiment of the invention.

In FIG. 1A, silicon substrate 102 suitable for integrated circuit manufacture is provided. Substrate 102 includes a P– type epitaxial surface layer on a P+ base layer (not shown). The epitaxial surface layer has a boron background concentration on the order of $1 \times 10^{15}$ atoms/cm$^3$, a <100> orientation and a resistivity of 12 ohm-cm.

In FIG. 1B, photoresist layer 104 is deposited on substrate 102. A photolithographic system, such as a step and repeat optical projection system which generates deep ultraviolet light from a mercury-vapor lamp, uses a first reticule to irradiate photoresist layer 104 with a first image pattern. Thereafter, the irradiated portions of photoresist layer 104 are removed, and photoresist layer 104 covers resistor region 106 of substrate 102 but includes an opening above active region 108 of substrate 102. Right boundary 110 for resistor region 106 and left boundary 112 for active region 108 are depicted by broken lines. Thus, resistor region 106 and active region 108 are separated from one another by a gap in substrate 102.

In FIG. 1C, a well implant, punchthrough implant, and threshold adjust implant are applied sequentially into active region 108 using photoresist layer 104 as an implant mask for resistor region 106. Although these implant steps are collectively represented by arrows 114, the three implants occur separately and in sequence. The well implant is provided by subjecting the structure to ion implantation of boron at a dose in the range of $1 \times 10^{12}$ to $1 \times 10^{13}$ atoms/cm$^2$ and an energy in the range of 100 to 170 kiloelectron-volts, the punchthrough implant is provided by subjecting the structure to ion implantation of boron at a dose in the range of $1 \times 10^{12}$ to $1 \times 10^{13}$ atoms/cm$^2$ and an energy in the range of 40 to 100 kiloelectron-volts, and the threshold adjust implant is provided by subjecting the structure to ion implantation of boron at a dose in the range of $1 \times 10^{12}$ to $1 \times 10^{13}$ atoms/cm$^2$ and an energy in the range of 2 to 30 kiloelectron-volts. Active region 108 continues to be doped P– with an increased boron background concentration on the order of about $1 \times 10^{16}$ atoms/cm$^3$.

Well implants, punchthrough implants, and threshold adjust implants are often used in the fabrication of IGFETs. The well implant provides a more uniform background doping, the punchthrough implant provides the channel with greater robustness to punchthrough voltages by laterally widening of the drain-depletion region below the top surface of the substrate, and the threshold adjust implant shifts the threshold voltage to a desired value such as 0.4 to 0.7 volts. Typically the threshold adjust implant has a peak concentration near the top surface of the substrate, the punchthrough implant has a peak concentration near the bottom of the source and drain, and the well implant has a peak concentration below the source and drain.

In FIG. 1D, photoresist layer 104 is removed, and photoresist layer 116 is deposited over substrate 102. The photolithographic system uses a second reticule to irradate photoresist layer 116 with a second image pattern, the irradiated portions of photoresist layer 116 are removed, and photoresist layer 116 covers active region 108 but contains an opening above resistor region 106.

In FIG. 1E, a well implant, punchthrough implant, and threshold adjust implant are applied sequentially into resistor region 106 using photoresist layer 116 as an implant mask for active region 108. Although these implant steps are collectively represented by arrows 118, the three implants occur separately and in sequence. These implant steps form diffused resistor 120 in resistor region 106. These implants also provide N-wells for P-channel devices (not shown) to be formed on other regions of substrate 102. The well implant is provided by subjecting the structure to ion implantation of phosphorus at a dose in the range of $1\times10^{12}$ to $1\times10^{13}$ atoms/cm$^2$ and an energy in the range of 200 to 600 kiloelectron-volts, the punchthrough implant is provided by subjecting the structure to ion implantation of phosphorus at a dose in the range of $1\times10^{12}$ to $1\times10^{13}$ atoms/cm$^2$ and an energy in the range of 100 to 300 kiloelectron-volts, and the threshold adjust implant is provided by subjecting the structure to ion implantation of phosphorus at a dose in the range of $1\times10^{12}$ to $1\times10^{13}$ atoms/cm$^2$ and an energy in the range of 20 to 100 kiloelectron-volts. Diffused resistor 120 is doped N− with a phosphorus concentration on the order of about $1\times10^{16}$ atoms/cm$^3$. Typically, a thermal cycle is applied to drive-in and distribute the well dopants before source/drain doping occurs.

In FIG. 1F, photoresist layer 116 is removed. Next, a blanket layer of gate oxide 122, composed of silicon dioxide (SiO$_2$), is formed on the top surface of substrate 102 using tube growth at a temperature of 700 to 1000° C. in an O$_2$ containing ambient. Gate oxide 122 has a thickness in the range of 30 to 100 angstroms. Thereafter, polysilicon layer 124 is deposited by low pressure chemical vapor deposition on the top surface of gate oxide 122. Polysilicon layer 124 has a thickness of 2000angstroms. If desired, polysilicon layer 124 can be doped in situ as deposition occurs, or doped before a subsequent etch step by implanting arsenic with a dosage in the range of $1\times10^{15}$ to $5\times10^{15}$ atoms/cm$^2$ and an energy in the range of 2 to 10 kiloelectron-volts. However, it is generally preferred that the polysilicon be initially doped during a subsequent source/drain implant step.

In FIG. 1G, photoresist layer 126 is deposited on polysilicon layer 124. The photolithographic system uses a third reticule to irradiate photoresist layer 126 with a third image pattern, the irradiated portions of photoresist layer 126 are removed, and photoresist layer 126 includes openings above the entire diffused resistor 120 and above selected portions of active region 108.

In FIG. 1H, an anisotropic dry etch is applied using photoresist layer 126 as an etch mask. Photoresist layer 126 protects the underlying regions of polysilicon layer 124, and the etch removes the regions of polysilicon layer 124 beneath the openings in photoresist layer 126. The etch is highly selective of polysilicon with respect to silicon dioxide, so only a negligible amount of gate oxide 122 beneath the openings in photoresist layer 126 is removed and substrate 102 is unaffected. The etch forms polysilicon gate 128 from the unetched portion of polysilicon layer 124 over active region 108. Gate 128 has opposing vertical sidewalls separated by a length of 3500 angstroms, and a thickness (or height above the underlying gate oxide 122) of 2000 angstroms. No polysilicon remains above diffused resistor 120.

In FIG. 1I, photoresist layer 126 is removed, and photoresist layer 130 is deposited over substrate 102. The photolithographic system uses the first reticule to irradiate photoresist layer 130 with the first image pattern, the irradiated portions of photoresist layer 130 are removed, and photoresist layer 130 covers diffused resistor 120 but contains an opening above active region 108.

In FIG. 1J, lightly doped source and drain regions 132 and 134 are implanted into active region 108 by subjecting the structure to ion implantation of phosphorus, indicated by arrows 136, at a dose in the range of $1\times10^{13}$ to $5\times10^{14}$ atoms/cm$^2$ and an energy of 2 to 35 kiloelectron-volts, using gate 128 as an implant mask for active region 108 and using photoresist layer 130 as an implant mask for diffused resistor 120. As a result, lightly doped source/drain regions 132 and 134 are implanted into 15 active region 108 outside gate 128 and are substantially aligned with the opposing sidewalls of gate 128. Lightly doped source/drain regions 132 and 134 are doped N− with a phosphorus concentration in the range of about $1\times10^{17}$ to $1\times10^{18}$ atoms/cm$^3$.

In FIG. 1K, photoresist layer 130 is removed, and oxide layer 138 with a thickness of 1000 angstroms is conformally deposited over the exposed surfaces by plasma enhanced chemical vapor deposition at a temperature in the range of 300 to 450° C. Oxide layer 138 contacts the top surface and opposing sidewalls of gate 128 and the regions of gate oxide 122 outside gate 128 but does not contact substrate 102. Oxide layer 138 covers all of diffused resistor 120 and active region 108. Preferably, oxide layer 138 has a thickness in the range of 350 to 2000 angstroms. This assures that large enough heavily doped source and drain regions will be subsequently formed and that diffused resistor 120 will be protected from a subsequent salicidation process, as described below.

In FIG. 1L, photoresist layer 140 is deposited on oxide layer 138. The photolithographic system uses the first reticule to irradiate photoresist layer 140 with the first image pattern, the irradiated portions of photoresist layer 140 are removed, and photoresist layer 140 covers diffused resistor 120 but contains an opening above active region 108.

In FIG. 1M, the structure is subjected to an anisotropic etch, such as a reactive ion etch, that is highly selective of silicon dioxide with respect to silicon and polysilicon. The anisotropic etch forms oxide spacers 142 adjacent to the opposing sidewalls of gate 128. Spacers 142 each laterally extend about 1000 angstroms across substrate 102. The anisotropic etch completely removes oxide layer 138 and gate oxide 122 above portions of active region 108 outside gate 128 and spacers 142. However, photoresist layer 140 provides an etch mask for the underlying region of oxide layer 138. As a result, the unetched portion of oxide layer 138 beneath photoresist layer 140 forms resistor-protect oxide 144 that covers diffused resistor 120. As is seen, spacers 142 are separated from resistor-protect oxide 144. Of importance, spacers 142 and resistor-protect oxide 144 are formed from the same oxide layer, thereby requiring fewer process steps than conventional approaches in which the spacers and resistor-protect insulator are formed from different layers at different times.

In FIG. 1N, heavily doped source and drain regions 146 and 148 are implanted into active region 108 by subjecting the structure to ion implantation of arsenic, indicated by arrows 150, at a dose in the range of $1\times10^{15}$ to $5\times10^{15}$ atoms/cm$^2$ and an energy of 10 to 80 kiloelectron-volts, using gate 128 and spacers 142 as an implant mask for active region 108 and using photoresist layer 140 as an implant mask for diffused resistor 120. As a result, heavily doped source/drain regions 146 and 148 are implanted into active region 108 outside gate 128 and spacers 142, are self-aligned to the outside edges of spacers 142, and are displaced from the opposing sidewalls of gate 128. Heavily doped source/drain regions 146 and 148 are doped N+ with an arsenic concentration in the range of about $1 \times 10^{18}$ to $1 \times 10^{20}$ atoms/cm$^3$.

In FIG. 10, photoresist layer 140 is removed, and the device is annealed to remove crystalline damage and to drive-in and activate the implanted dopants in active region 108 by applying a rapid thermal anneal on the order of 950 to 1050° C. for 10 to 60 seconds. As a result, an N-channel IGFET is formed with a source (consisting of source regions 132 and 146) and a drain (consisting of drain regions 134 and 148) controlled by gate 128.

In FIG. 1P, titanium layer 152 with a thickness in the range of 100 to 350 angstroms is deposited over substrate 102. Preferably, titanium layer 152 is deposited directly on gate 128 and heavily doped source/drain regions 146 and 148 without any intervening native oxide. Titanium layer 152 is also deposited on resistor-protect oxide 144.

In FIG. 1Q, a rapid thermal anneal on the order of 700° C. for 30 seconds is applied in a nitrogen ambient to convert portions of titanium layer 152 over gate 128, heavily doped source region 146 and heavily doped drain region 148 into titanium silicide contacts 154, 156 and 158, respectively. The portions of titanium layer 152 over spacers 142 and resistor-protect oxide 144 remain unreacted. Thereafter, the unreacted titanium (including titanium nitride) is stripped, and a subsequent anneal at 750 to 800° C. for 30 seconds is applied to lower the resistivity of titanium silicide contacts 154, 156 and 158. Titanium silicide contacts 154, 156 and 158 have a thickness in the range of 200 to 600 angstroms and are separated from one another. Moreover, no titanium silicide reaches diffused resistor 120 beneath resistor-protect oxide 144. The silicon dioxide between titanium layer 152 and diffuised resistor 120 is at least 350 angstroms to assure that it is not consumed by the titanium silicidation process. Therefore, gate oxide 122 is not thick enough to provide the resistor-protect oxide.

In FIG. 1R, oxide layer 160 with a thickness of 12,000 to 15,000 angstroms is conformally deposited over the exposed surfaces by plasma enhanced chemical vapor deposition at a temperature in the range of 300 to 450° C. Thereafter, oxide layer 160 is polished to obtain a planar top surface. Next, contact windows are formed in oxide layer 160 above titanium silicide contacts 154, 156 and 158, and above terminal ends 162 and 164 of diffused resistor 120 using another photoresist layer (not shown) in conjunction with another etch step. The contact windows are then filled with metal plugs. Preferably, the metal plugs are formed by depositing a thin blanket adhesion layer of titanium and titanium nitride over the substrate, depositing a thick blanket layer of tungsten on the adhesion layer and into any remaining space in the contact windows, and planarizing the structure by polishing to form metal plugs 166, 168, 170, 172 and 174 in contact with terminal ends 162 and 164 and silicide contacts 156, 154 and 158, respectively, and aligned with the top surface of oxide layer 160.

Figure 2A:
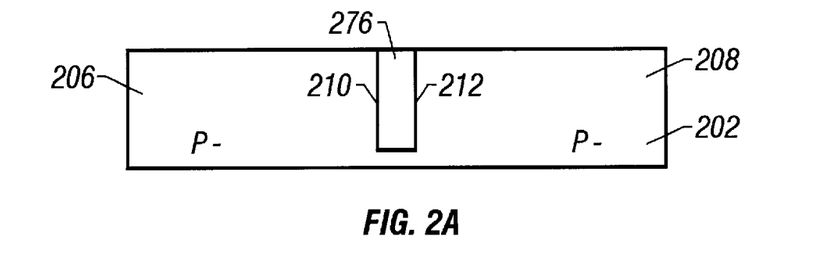
FIGS. 2A–2N show cross-sectional views of successive process steps for making an IGFET and a protected resistor in accordance with a second embodiment of the invention.
Figure 2B:
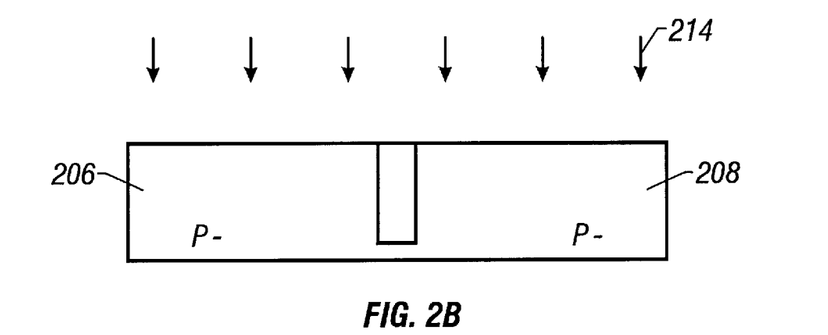
Figure 2C:
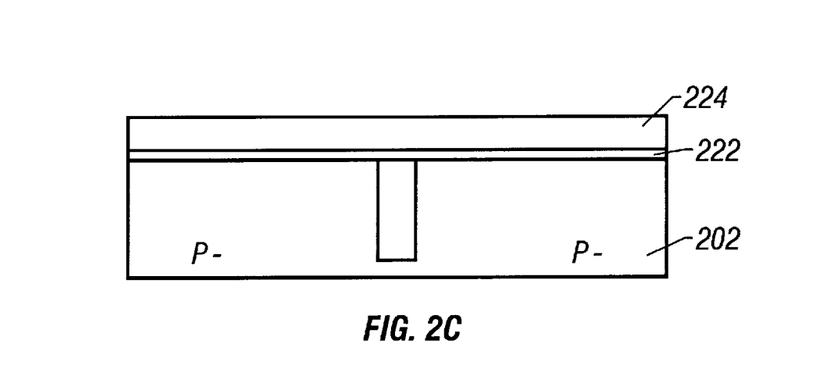
Figure 2D:
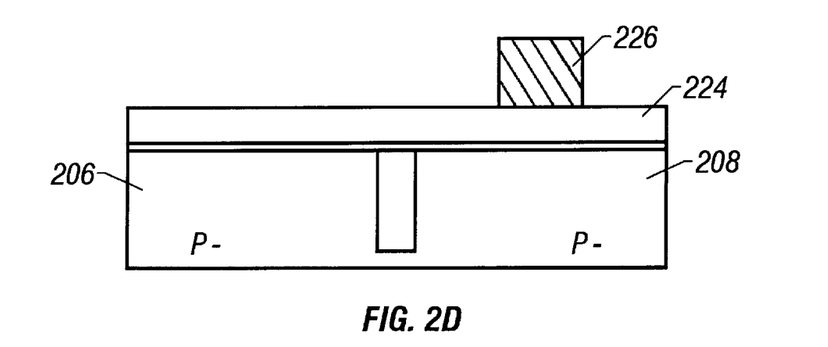
Figure 2E:
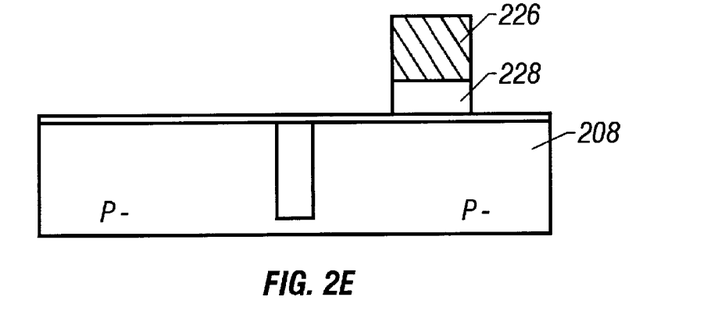
Figure 2F:
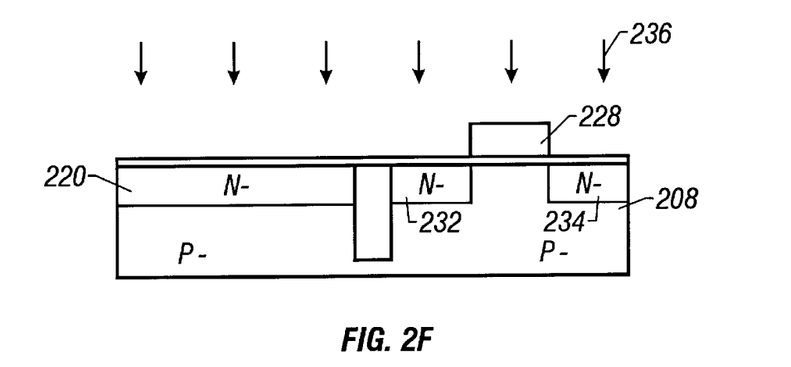
Figure 2G:
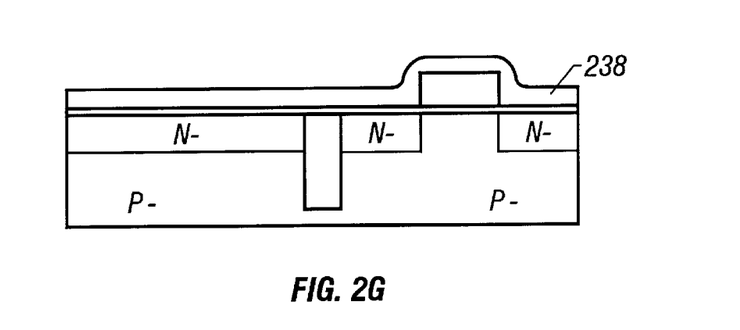
Figure 2H:
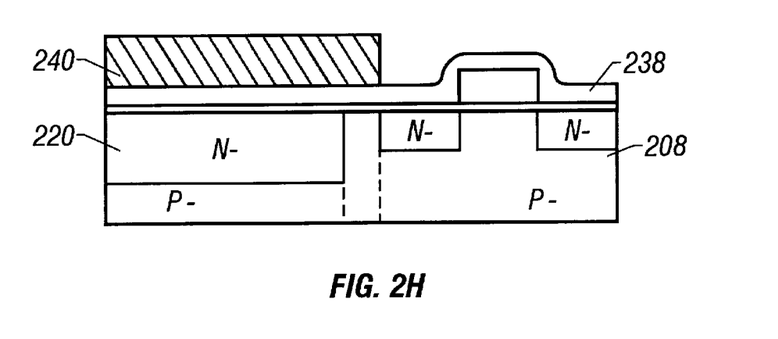
Figure 2I:
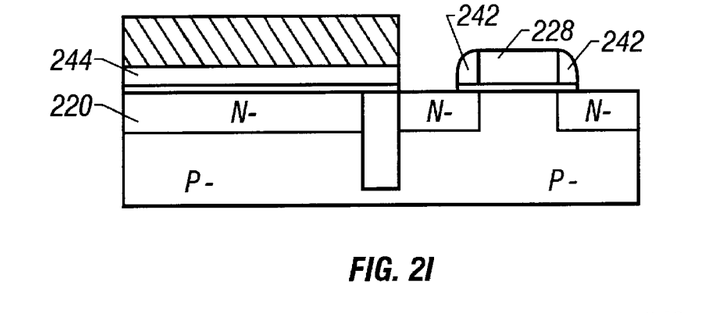
Figure 2J:
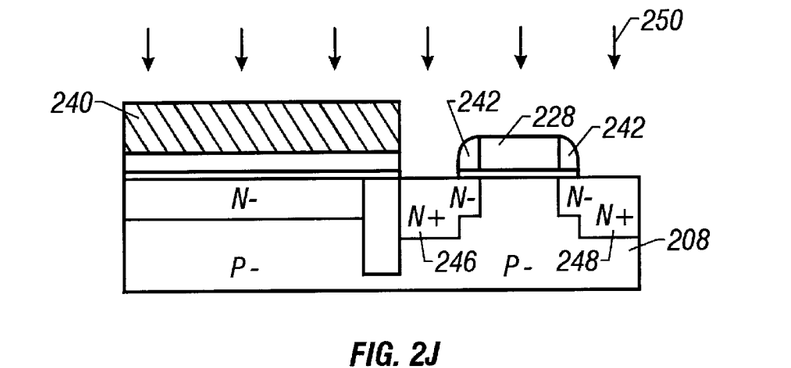
Figure 2K:
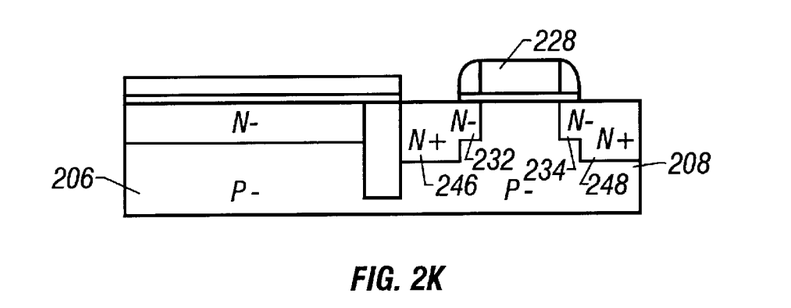
Figure 2L:
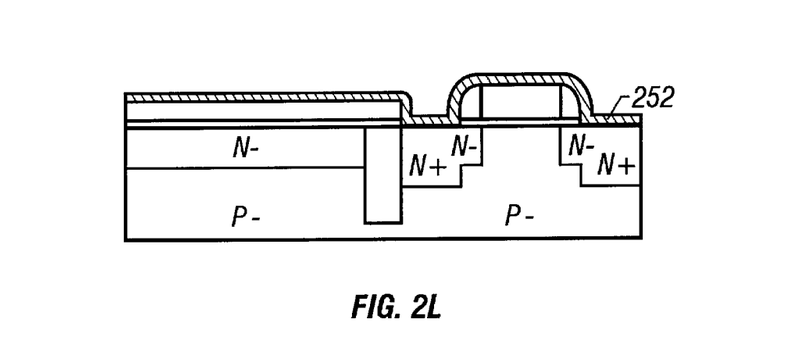
Figure 2M:
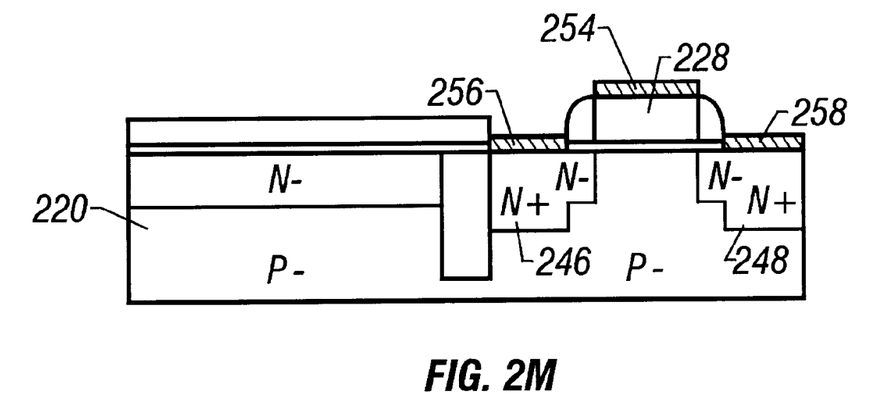
Figure 2N:
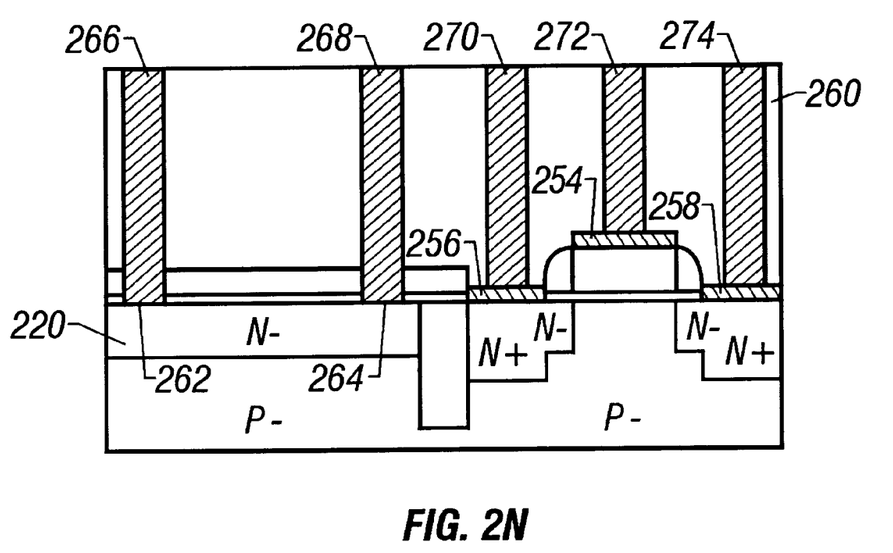

FIGS. 2A–2N show cross-sectional views of successive process steps for making an IGFET and a protected resistor in accordance with a second embodiment of the invention. In the first embodiment, the diffused resistor is doped in a like manner to N-wells for P-channel devices formed on other regions of the substrate. In some instances, it may be desirable to dope the diffused resistor differently than the N-wells to obtain a particular resistance. In other instances, a CMOS process may not be available. The primary difference between the second embodiment and the first embodiment is that in the second embodiment an NMOS process is used, a trench oxide is disposed between the diffused resistor and the IGFET, and the diffused resistor is doped as the lightly doped source and drain regions are implanted. Unless otherwise noted, the elements for the second embodiment (e.g., substrate 202, gate oxide 222, etc.) are similar to elements of the first embodiment (e.g., substrate 102, gate oxide 122, etc.), and the description of related elements and process steps need not be repeated.

In FIG. 2A, silicon substrate 202 suitable for integrated circuit manufacture is provided. Trench oxide 276, composed of silicon dioxide, is disposed in substrate 202 and provides dielectric isolation between resistor region 206 and active region 208. Boundaries 210 and 212 are provided by the sidewalls of trench oxide 276.

In FIG. 2B, resistor region 206 and active region 208 are subjected to a well implant, a punchthrough implant, and threshold adjust implant collectively represented by arrows 214.

In FIG. 2C, gate oxide 222 is grown on substrate 202, and undoped polysilicon layer 224 is deposited on gate oxide 222.

In FIG. 2D, photoresist layer 226 is deposited on polysilicon layer 224 and patterned to include openings above the entire resistor region 206 and above selected portions of active region 208.

In FIG. 2E, an anisotropic dry etch is applied using photoresist layer 226 as an etch mask to remove the regions of polysilicon layer 224 beneath the openings in photoresist layer 226 and to form polysilicon gate 228 from the unetched portion of polysilicon layer 224 over active region 208.

In FIG. 2F, photoresist layer 226 is stripped, diffused resistor 220 is implanted into resistor region 206, and lightly doped source and drain regions 232 and 234 are implanted into active region 208 by subjecting the structure to ion implantation of phosphorus, indicated by arrows 236, using gate 228 as an implant mask for active region 208. Diffused resistor 220 and lightly doped source/drain regions 232 and 234 are simultaneously doped N–. Furthermore, diffused resistor 220 has a different geometry, doping concentration and resistance than diffused resistor 120.

In FIG. 2G, oxide layer 238 is conformally deposited over the exposed surfaces.

In FIG. 2H, photoresist layer 240 is deposited on oxide layer 238 and patterned so that it covers diffused resistor 220 but contains an opening above active region 208.

In FIG. 2I, the structure is subjected to an anisotropic etch that forms spacers 242 adjacent to the opposing sidewalls of gate 228 and resistor-protect oxide 244 that covers diffused resistor 220. Of importance, spacers 242 and resistor-protect oxide 244 are formed from the same oxide layer.

In FIG. 2J, heavily doped source and drain regions 246 and 248 are implanted into active region 208 by subjecting the structure to ion implantation of arsenic, indicated by arrows 250, using gate 228 and spacers 242 as an implant mask for active region 208 and using photoresist layer 240 as an implant mask for diffused resistor 220. Heavily doped source/drain regions 246 and 248 are doped N+.

In FIG. 2K, photoresist layer 240 is removed, and the device is annealed to remove crystalline damage and to drive-in and activate the implanted dopants in resistor region 206 and active region 208 by applying a rapid thermal anneal. As a result, an N-channel IGFET is formed with a source (consisting of source regions 232 and 246) and a drain (consisting of drain regions 234 and 248) controlled by gate 228.

In FIG. 2L, titanium layer 252 is deposited over the structure.

In FIG. 2M, a rapid thermal anneal is applied in a nitrogen ambient to convert portions of titanium layer 252 over gate 228, heavily doped source region 246 and heavily doped drain region 248 into titanium silicide contacts 254, 256 and 258, respectively. Thereafter, the unreacted titanium (including titanium nitride) is stripped, and a subsequent anneal is applied to lower the resistivity of titanium silicide contacts 254, 256 and 258.

In FIG. 2N, oxide layer 260 is conformally deposited over the exposed surfaces, the top surface of oxide layer 260 is planarized by polishing, and contact windows are formed in oxide layer 260 above titanium silicide contacts 254, 256 and 258 and above terminal ends 262 and 264 of diffused resistor 220. The contact windows are then filled with metal plugs 266, 268, 270, 272 and 274.

Further processing steps in the fabrication of IGFETs typically include forming additional metallization such as aluminum over the structure to selectively interconnect the plugs, and then forming a passivation layer over the structure. In addition, earlier or subsequent high-temperature process steps can be used to supplement or replace the anneal steps to provide the desired anneal, activation, and drive-in functions. These further processing steps are conventional. Likewise the principal processing steps disclosed herein may be combined with other steps apparent to those skilled in the art.

The present invention includes numerous variations to the embodiments described above. For instance, the punch-through and threshold adjust implants may not be essential. Likewise, the source and drain need not necessarily include lightly doped regions, and the silicide contacts need not necessarily be formed. The spacers need not necessarily be formed adjacent to the sidewalls of the gate, for instance if a thin dielectric layer has previously been formed on the gate, as long as the spacers are formed in close proximity to the opposing sidewalls of the gate. If the masking layer (e.g., photoresist layers 140 and 240) is removed before implanting the heavily doped source/drain regions, the resistor-protect insulator (e.g., oxides 144 and 244) can provide an implant mask for the diffused resistor.

The gate material can be various conductors, the gate insulator and insulating layer (e.g., oxide layers 138 and 238) can be various dielectrics such as silicon dioxide, silicon nitride and silicon oxynitride, and the silicide contacts can be formed from various refractory metals. Other masking layers besides photoresist can be employed, such as silicon nitride patterned using photolithography. If desired, the insulating layer can include several dielectric layers, such as a silicon nitride on silicon dioxide or silicon oxynitride layer, or such as silicon nitride or silicon oxynitride on silicon dioxide. The active region can be isolated from other active regions and/or the resistor region using various techniques such as LOCOS oxidation.

The diffused resistor can be doped by ion implantation or solid phase diffusion, and can have the same or opposite conductivity type as the substrate. The entire diffused resistor can be covered by the resistor-protect insulator, or alternatively, small portions of the diffused resistor can remain uncovered. For instance, it may be desirable to form silicide contacts on the terminal ends of the diffused resistor.

Suitable N-type dopants include arsenic and phosphorus; suitable P-type dopants include boron $B_{10}$, boron $B_{11}$, and $BF_x$ species such as $BF_2$.

The invention is particularly well-suited for fabricating N-channel MOSFETs, P-channel MOSFETs and other types of IGFETs, particularly for high-performance microprocessors where high circuit density is essential. Although a single N-channel device and diffused resistor have been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making an IGFET and a protected resistor, the protected resistor being separated from the IGFET, comprising:

providing a semiconductor substrate with an active region and a resistor region, the active region and the resistor region being separated by an electrically-insulating intermediate region;

forming a gate over the active region;

forming a diffused resistor in the resistor region;

forming an insulating layer over the gate, the diffused resistor, and the intermediate region;

forming a masking layer over the insulating layer, wherein the masking layer covers the resistor region and the intermediate region and includes an opening above the active region;

applying an etch using the masking layer as an etch mask, wherein unetched portions of the insulating layer over the active region form spacers in close proximity to opposing sidewalls of the gate, and an unetched portion of the insulating layer over the resistor region forms a resistor-protect insulator; and forming a source and a drain in the active region.

2. The method of claim 1, wherein the diffused resistor is doped by solid phase diffusion from an overlaying layer.

3. The method of claim 1, wherein the diffused resistor is doped by ion implantation.

4. The method of claim 1, wherein the diffused resistor is doped before any doping is provided for the source and the drain.

5. The method of claim 1, wherein the diffused resistor, the source and the drain are doped simultaneously.

6. The method of claim 1, wherein the active region and the resistor region are separated from one another by and adjacent to the intermediate region in the substrate.

7. The method of claim 1, wherein the insulating layer is a conformal layer.

8. The method of claim 1, wherein the spacers are beneath the opening in the masking layer.

9. The method of claim 1, wherein forming the source and the drain includes:
   implanting lightly doped source and drain regions into the active region during a first implant step using the gate as an implant mask before forming the insulating layer; and
   implanting heavily doped source and drain regions into the active region during a second implant step using the gate and the spacers as an implant mask.

10. The method of claim 9, wherein forming the diffused resistor includes:
    implanting the diffused resistor into the resistor region during the first implant step; and
    protecting the diffused resistor from further doping during the second implant step.

11. The method of claim 9, including removing the masking layer before the second implant step.

12. The method of claim 9, including removing the masking layer after the second implant step.

13. The method of claim 1, wherein the diffused resistor, the source and the drain extend to a top surface of the substrate.

14. The method of claim 1, wherein the spacers are adjacent to the opposing sidewalls of the gate.

15. The method of claim 1, including removing the masking layer after applying the etch.

16. The method of claim 1, including forming silicide contacts on the gate, the source and the drain without forming any silicide beneath the resistor-protect insulator.

17. The method of claim 1, wherein the gate is polysilicon, the insulating layer is silicon dioxide, and the masking layer is photoresist.

18. An integrated circuit chip, including an IGFET fabricated in accordance with the method of claim 1.

19. An electronic system including a microprocessor, a memory and a system bus, and further including an IGFET fabricated in accordance with the method of claim 1.

20. A method of making an IGFET and a protected resistor, the protected resistor being separated from the IGFET, comprising:
    mproviding a semiconductor substrate with an active region and a resistor region, the active region and the resistor region being separated by an electrically-insulating isolation region;
    forming a gate insulator over the active region;
    forming a gate on the gate insulator and over the active region;
    forming a diffused resistor in the resistor region;
    forming an insulating layer over the gate, the isolation region and the diffused resistor, wherein the insulating layer covers all of the active region, isolation region and the resistor region;
    forming a masking layer over the insulating layer, wherein the masking layer covers the resistor region and the isolation region and includes an opening above the active region;
    applying an anisotropic etch using the masking layer as an etch mask, wherein unetched portions of the insulating layer over the active region form spacers adjacent to opposing sidewalls of the gate, and an unetched portion of the insulating layer over the resistor region forms a resistor-protect insulator; and
    forming a source and a drain in the active region.

21. The method of claim 20, including:
    forming the gate insulator on the active region, the isolation region and the resistor region; and
    forming the insulating layer on the gate and the gate insulator without contacting the substrate.

22. The method of claim 20, wherein forming the source and the drain includes:
    implanting lightly doped source and drain regions into the active region during a first implant step using the gate alone as an implant mask for the active region before forming the insulating layer; and
    implanting heavily doped source and drain regions into the active region during a second implant step using the gate and the spacers as an implant mask as an implant mask for the active region.

23. The method of claim 22, including removing the masking layer before the second implant step.

24. The method of claim 22, including removing the masking layer after the second implant step.

25. The method of claim 22, including providing all doping for the diffused resistor before the first implant step.

26. The method of claim 22, including providing all doping for the diffused resistor during the first implant step.

27. The method of claim 22, wherein the lightly doped source and drain regions are substantially aligned with the opposing sidewalls of the gate, and the heavily doped source and drain regions are substantially displaced from the opposing sidewalls of the gate.

28. The method of claim 20, wherein applying the anisotropic etch removes portions of the gate insulator over the active region and outside the spacers and the gate.

29. The method of claim 20, including:
    depositing a refractory metal over the active region and the resistor region, wherein the refractory metal contacts the gate, the source, the drain, the spacers, and the resistor protect insulator;
    applying a thermal cycle to react the refractory metal with the gate, the source and the drain, thereby forming silicide contacts on the gate, the source and the drain without forming any silicide beneath the resistor-protect insulator; and
    stripping the unreacted refractory metal on the spacers and on the resistor-protect insulator.

30. The method of claim 29, wherein the refractory metal is titanium and the silicide contacts are titanium silicide.

31. The method of claim 20, wherein forming the insulating layer includes:
    depositing a first insulating layer over the substrate; and
    depositing a second insulating layer on the first insulating layer, wherein the first and second insulating layers are different dielectric materials.

32. The method of claim 31, wherein the first insulating layer is selected from the group consisting of silicon dioxide and silicon oxynitride, and the second insulating layer is selected from the group consisting of silicon nitride and silicon oxynitride.

33. The method of claim 20, wherein the substrate is a first conductivity type, and the diffused resistor and the source and the drain are a second conductivity type opposite the first conductivity type.

34. The method of claim 20, wherein the gate is polysilicon, the gate insulator and the insulating layer are silicon dioxide, and the masking layer is photoresist.

35. The method of making an IGFET and a protected resistor, the protected resistor being separated from the IGFET comprising:
    providing a semiconductor substrate with an active region and a resistor region of first conductivity type an undoped isolation region between the active region and the resistor region;

forming a diffused resistor of second conductivity type in the resistor region;

growing a gate oxide on the active region, the isolation region, and the resistor region;

depositing a polysilicon layer on the gate oxide;

forming a first photoresist layer over the polysilicon layer;

etching the polysilicon layer through openings in the first photoresist layer using the first photoresist layer as a first etch mask such that an unetched portion of the polysilicon layer over the active region forms a gate;

removing the first photoresist layer;

implanting lightly doped source and drain regions of the second conductivity type into the active region using the gate as an implant mask for the active region, wherein the lightly doped source and drain regions form channel junctions substantially aligned with opposing sidewalls of the gate;

depositing a conformal oxide layer over the active region, the isolation region and the resistor region after implanting the lightly doped source and drain regions, wherein the conformal oxide layer contacts the gate and the gate oxide without contacting the substrate;

forming a second photoresist layer over the conformal oxide layer;

etching the conformal oxide layer through an opening in the second photoresist layer using the second photoresist layer as a second etch mask, wherein regions of the conformal oxide layer beneath the opening in the second photoresist layer form spacers adjacent to the opposing sidewalls of the gate, and another region of the conformal oxide layer beneath the second photoresist layer forms a resistor-protect oxide over the diffused resistor;

implanting heavily doped source and drain regions of the second conductivity type into the active region using the gate and the spacers as an implant mask for the active region;

removing the second photoresist layer;

applying a first thermal cycle to drive-in and activate implanted dopants in the active region, thereby forming a source in the active region that includes the lightly and heavily doped source regions and forming a drain in the active region that includes the lightly and heavily doped drain regions;

depositing a titanium layer over the active region and the resistor region after applying the first thermal cycle, wherein the titanium layer contacts the gate, the source, the drain, the spacers, and the resistor-protect oxide without contacting the diffused resistor;

applying a second thermal cycle to react the titanium layer with the gate, the source and the drain, thereby forming titanium silicide contacts on the gate, the source and the drain without forming any titanium silicide on the diffused resistor; and stripping the unreacted titanium on the spacers and on the resistor-protect oxide.

36. The method of claim 35, including forming the diffused resistor before implanting the lightly doped source and drain regions.

37. The method of claim 35, including using the second photoresist layer as an implant mask for the diffused resistor while implanting the heavily doped source and drain regions.

38. The method of claim 35, wherein the first conductivity type is P-type and the second conductivity type is N-type.

39. The method of claim 35, wherein the steps are performed in the sequence set forth.

* * * * *

UNITED STATES PATENT AND TRADEMARK OFFICE
CERTIFICATE OF CORRECTION

PATENT NO.    : 6,096,591
ISSUE DATE    : August 1, 2000
INVENTOR(S)   : Gardner, Mark I.; Kadosh, Daniel; Wristers, Derick J.

It is certified that error appears in the above-identified patent and that said Letters Patent is hereby corrected as shown below:

Title page, following item [56],
Under "OTHER PUBLICATIONS" line 6, delete "353-355" and insert --733-736--.
Under "OTHER PUBLICATIONS" line 9, delete "733-756" and insert --353-355--.
Column 11, line 41 delete "mproviding" and insert --providing--.

Signed and Sealed this

First Day of May, 2001

Attest:

NICHOLAS P. GODICI

*Attesting Officer*    *Acting Director of the United States Patent and Trademark Office*